United States Patent [19]

Chou

[11] Patent Number: 5,566,053
[45] Date of Patent: Oct. 15, 1996

[54] ELECTRIC RECEPTACLE ASSEMBLY

[76] Inventor: Jonie Chou, 6F, No. 2, Lane 348, Chung Shan Rd., Sec. 1, Chung Ho City, Taipei Hsien, Taiwan

[21] Appl. No.: 541,121

[22] Filed: Oct. 11, 1995

[51] Int. Cl.⁶ .................................................. H05K 5/00
[52] U.S. Cl. ........................ 361/753; 361/752; 361/799; 361/802; 439/61; 174/50
[58] Field of Search ..................................... 361/752, 753, 361/756, 796, 799, 800, 801, 802, 829, 823, 833; 174/50; 439/61, 325, 374, 377; 206/334, 328; 333/246, 247

[56] References Cited

U.S. PATENT DOCUMENTS

| | | | |
|---|---|---|---|
| 4,841,414 | 6/1989 | Hibino et al. | 361/424 |
| 5,091,826 | 2/1992 | Arnett et al. | 361/408 |
| 5,355,276 | 10/1994 | Chal | 361/679 |

Primary Examiner—Leo P. Picard
Assistant Examiner—Y. Whang
Attorney, Agent, or Firm—Morton J. Rosenberg; David I. Klein

[57] ABSTRACT

An electric receptacle assembly including a flat base plate and a cover shell, wherein the flat base plate has two upright partition boards, two rows of upright metal frames respectively extended outwards from the upright partition boards, a circuit board supported between the partition boards, two pairs of metal contact plates fastened to respective bevel slots on the upright metal frames and connected to the circuit board by conductors, two metal contact rods respectively connected to the circuit board for connection to power supply, and two ground conductors respectively connected to the circuit board; the cover shell has two sets of plug holes on two bevel bearing surfaces at two opposite sides thereof corresponding to the metal contact plates for mounting electric plugs.

2 Claims, 3 Drawing Sheets

ELECTRIC RECEPTACLE ASSEMBLY

BACKGROUND OF THE INVENTION

The present invention relates to electric receptacles, and relates more particularly to an electric receptacle assembly which is simple in structure.

Conventional electric receptacles are commonly comprised of a receptacle body and a shell mounted in the receptacle body. When two metal contact plates are mounted inside the shell, the shell is plugged into a hole on the receptacle body. The shell has a wire hole for passing an electric wire, which has one end connected to the metal contact plates and an opposite end connected to two metal contact rods on the outside of the receptacle body for connection to power supply. Because the electric wire is connected to the metal contact plates and the metal contact rods by welding, much labor is needed, and the assembly process is complicated. Furthermore, regular electric receptacles are not safe in use because the plug holes are commonly disposed at the top side, and objects may drop through the plug holes to the inside to contact the metal contact plates, causing an electric leakage.

SUMMARY OF THE INVENTION

The present invention has been accomplished to provide an electric receptacle assembly which eliminates the aforesaid drawbacks. According to the preferred embodiment of the present invention, the electric receptacle assembly comprises a flat base plate and a cover shell covered on the flat base plate. The flat base plate comprises two upright partition boards, two rows of upright metal frames respectively extended outwards from the upright partition boards, a circuit board supported between the partition boards, two pairs of metal contact plates fastened to respective bevel slots on the upright metal frames and connected to the circuit board by conductors, two metal contact rods respectively connected to the circuit board for connection to power supply, and two ground conductors respectively connected to the circuit board. The cover shell comprises two sets of plug holes on two bevel bearing surfaces at two opposite sides thereof corresponding to the metal contact plates for mounting electric plugs.

DETAILED DESCRIPTION OF THE PREFERRED EMBODIMENT

Figure 1:
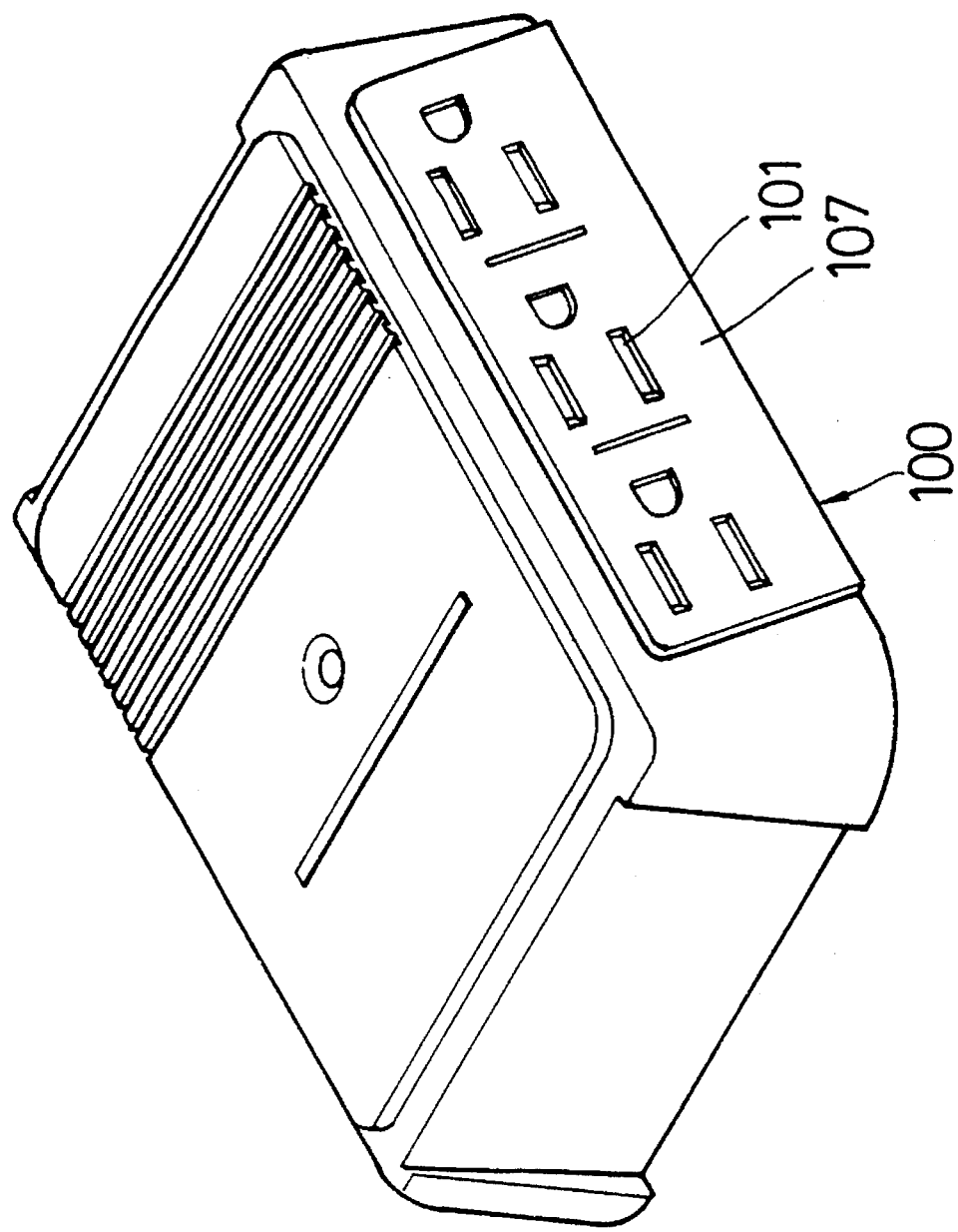
FIG. 1 is an elevational view of an electric receptacle assembly according to the present invention.

Referring to FIG. 1, the electric receptacle assembly, referenced by 100, has two bevel bearing surfaces 107 sloping downwardly outwards at two opposite sides, and sets of plug holes 101 on each bevel bearing surface 107 for mounting electric plugs. Because each of the bevel bearing surface 107 slopes downwardly outwards, the user can conveniently connect an electric plug to one set of plug holes 101.

Figure 2:
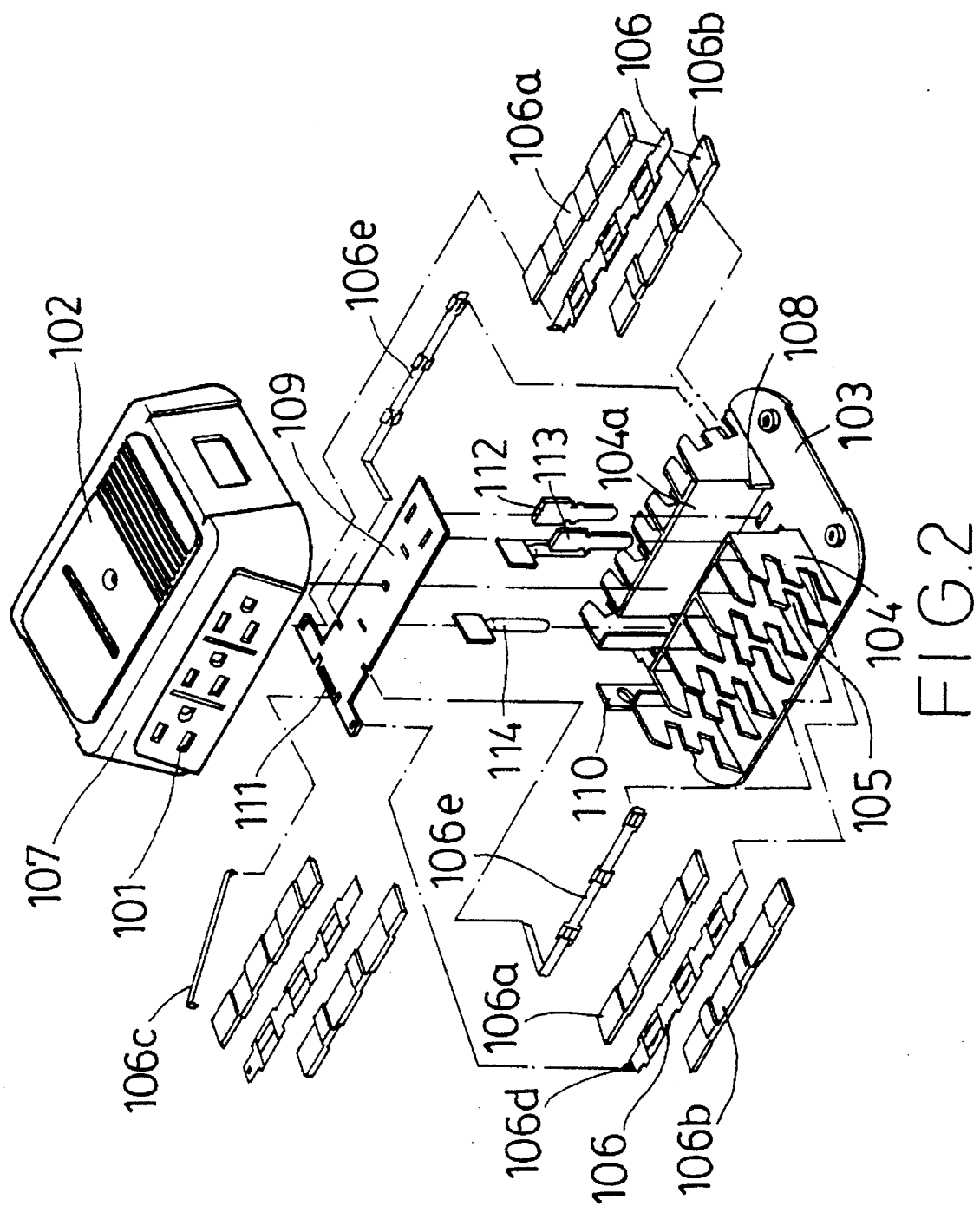
FIG. 2 is an exploded view of the electric receptacle assembly shown in FIG. 1.

Referring to FIG. 2, the electric receptacle assembly comprises a flat base plate 103, and a cover shell 102 covered on the base 103. The aforesaid bevel bearing surfaces 107 is made on the cover shell 102 at two opposite sides. The flat base plate 103 comprises two upright partition boards 104a longitudinally disposed in a parallel relation, two sets of metal upright frames 104 transversely disposed at two opposite sides and respectively perpendicularly extended outwards from the upright partition boards 104a, two pairs of vertically spaced metal contact plates 106 respectively fastened to the two sets of metal upright frames 104. Each of the metal contact plates 106 is covered with a top insulation strip 106a and a bottom insulation strip 106b. Each of the metal upright frames 104 defines two inwardly sloping slots 105 at different elevations for holding one pair of metal contact plates 106. The lower one of each pair of metal contact plates 106 has a tip 106 at one end connected to a circuit board 109. Each of the partition board 104a has a back projection 108 at one end. The circuit board 9 is disposed between the partition boards 104a, having one end supported on the back projections 108 of the upright partition boards 104a, and an opposite end made with a slot 111 coupled to an upright support 110 on the flat base plate 103. Two substantially L-shaped ground conductors 106e are provided and connected to the circuit board 109 at two opposite sides, each having one end connected to the circuit board 109 and an opposite end connected to a respective locating plug rod 114 on the flat base plate 103. The tilt angle of the inwardly sloping slot 105 of each metal upright frame 104 is disposed perpendicular to one bevel bearing surface 107. Two metal contact rods 112 and 113 are respectively connected to the circuit board 109 at the bottom side and extended out of the flat base plate 103 for connection to power supply for permitting electricity to be transmitted through the circuit board 109 to the metal contact plates 106. When all component parts are installed in the flat base plate 103, the cover shell 102 is fixed to the flat base plate 103 by screws.

Figure 4:
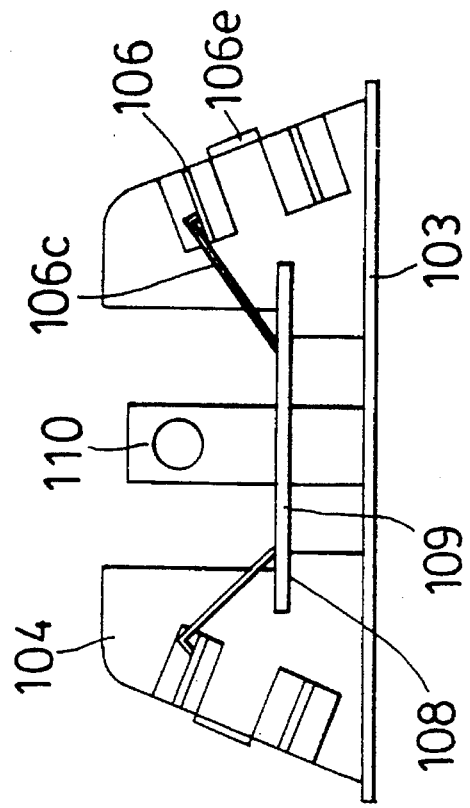
FIG. 4 shows the positioning of the circuit board according to the present invention.
Figure 3:
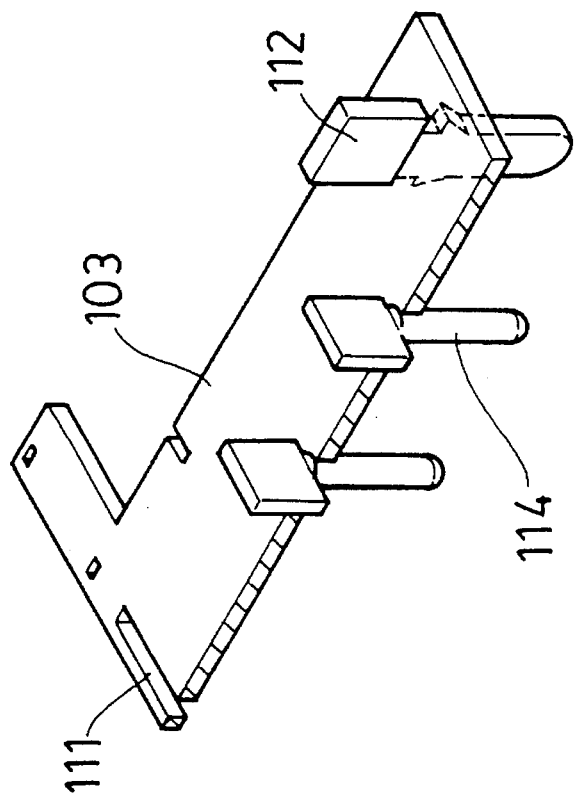
FIG. 3 shows the positioning of the metal contact rods and the locating plug rods on the circuit board according to the present invention.

Referring to FIG. 4, the circuit board 109 is horizontally supported on the back projections 108 of the partition boards 104a. The contact metal plates 106 are fastened to the inwardly sloping slots 105 of the metal upright frames 104 and connected to two opposite sides of the circuit board 109 by conductors. As illustrated, the upright support 110 is inserted into the slot 111 of the circuit board 109 to hold the circuit board 109 in place.

It is to be understood that the drawings are designed for purposes of illustration only, and are not intended as a definition of the limits and scope of the invention disclosed.

I claim:

1. An electric receptacle assembly comprising:

a flat base plate having two upright partition boards longitudinally disposed in a parallel relation, two sets of metal upright frames transversely disposed at two opposite sides and respectively perpendicularly extended outwards from said upright partition boards, two pairs of vertically spaced metal contact plates respectively fastened to said two sets of metal upright frames, each of said metal contact plates being covered with a top insulation strip and a bottom insulation strip, each of the upright frame defining two inwardly sloping slots at different elevations for holding one pair of metal contact plates, a circuit board supported between said partition boards, one of each pair of metal contact plates having a tip at one end connected to said circuit board, two substantially L-shaped ground conductors respectively connected to said circuit board at two opposite sides, each ground conductor having one end connected to said circuit board and an opposite end connected to a respective locating plug rod on said flat base plate, two metal contact rods respectively connected to said circuit board for connection to power supply for permitting electricity to be transmitted through said circuit board to said metal contact plate; and a cover shell covered on said flat base plate, having two bevel bearing surfaces sloping downwardly outwards at two opposite sides and disposed at a tilt angle perpendicular to the inwardly sloping slots of said two sets of metal upright frames respectively, and sets of plug holes on each bevel bearing surface corresponding to said metal contact plates for mounting electric plugs.

2. The electric receptacle assembly of claim 1 wherein said partition boards have a respective back projection at one end; said metal contact plates are respectively connected to two opposite sides of said circuit board by conductors; said circuit board is disposed in a horizontal position having one end supported on the back projections of said partition boards, and an opposite end made with a slot coupled to an upright support on said flat base plate.

\* \* \* \* \*